US009542983B1

(12) United States Patent
Kim et al.

(10) Patent No.: US 9,542,983 B1
(45) Date of Patent: Jan. 10, 2017

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventors: Min Chang Kim, Seoul (KR); Chang Hyun Kim, Seoul (KR); Do Yun Lee, Yongin-si (KR); Jae Jin Lee, Gwangju-si (KR); Hun Sam Jung, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/882,942

(22) Filed: Oct. 14, 2015

(30) Foreign Application Priority Data

Jun. 16, 2015 (KR) .................. 10-2015-0085162

(51) Int. Cl.
*G11C 7/10* (2006.01)
*G11C 7/22* (2006.01)
*G11C 7/12* (2006.01)

(52) U.S. Cl.
CPC ............... *G11C 7/222* (2013.01); *G11C 7/10* (2013.01); *G11C 7/12* (2013.01)

(58) Field of Classification Search
CPC .............. G11C 7/222; G11C 7/10; G11C 7/12
USPC ............... 365/189.05, 129, 189.011, 189.17, 365/189.08, 193, 194, 221
See application file for complete search history.

(56) References Cited

FOREIGN PATENT DOCUMENTS

KR 100673678 B1 1/2007
KR 1020110002302 A 1/2011

*Primary Examiner* — Fernando Hidalgo
(74) *Attorney, Agent, or Firm* — William Park & Associates Ltd.

(57) ABSTRACT

A semiconductor device may include a buffer control signal generation circuit, an input control signal generation circuit and an internal data generation circuit. The buffer control signal generation circuit may be configured to generate a buffer control signal. The buffer control signal may be enabled in synchronization with a point of time that a predetermined section elapses from a point of time that a write command signal is generated. The input control signal generation circuit may be configured to receive a data strobe signal to generate an input control signal, in response to the buffer control signal. The internal data generation circuit may be configured to receive a data signal to generate internal data.

14 Claims, 16 Drawing Sheets

9,542,983 B1

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Patent Application No. 10-2015-0085162, filed on Jun. 16, 2015, in the Korean Intellectual Property Office, which is incorporated herein by reference in its entirety as set forth in full.

BACKGROUND

1. Technical Field

Embodiments of the present disclosure generally relate to semiconductor devices having an input control signal generation circuit and semiconductor systems including the same.

2. Related Art

Recently, for fast operation of semiconductor systems including semiconductor devices a plurality of input/output (I/O) control signals generated from data strobe signals have been used. The I/O control signals may be set to have different phases from each other and may be used in the I/O of data. The semiconductor devices may generate four I/O control signals between which a phase difference of 90 degrees exists and may receive or output the data using the four I/O control signals. In such a case, the semiconductor devices may operate at a higher speed than other semiconductor devices that receive or output the data using a data strobe signal.

SUMMARY

According to an embodiment, a semiconductor device may be provided. The semiconductor device may include a buffer control signal generation circuit, an input control signal generation circuit and an internal data generation circuit. The buffer control signal generation circuit may be configured to generate a buffer control signal enabled in synchronization with a point of time that a predetermined section elapses from a point of time that a write command signal is generated. The input control signal generation circuit may be configured to receive a data strobe signal to generate an input control signal, in response to the buffer control signal. The internal data generation circuit may be configured to receive a data signal to generate internal data, in synchronization with the input control signal.

According to an embodiment, there may be provided a semiconductor device. The semiconductor device may include a reset signal generator configured for generating a reset signal enabled in synchronization with a point of time that a predetermined section elapses from a point of time that a write command signal is generated. The semiconductor device may include a first divider configured for generating third and fourth input control signals from first and second input control signals in synchronization with a first internal data strobe signal. The semiconductor device may include a second divider configured for generating the first and second input control signals from the third and fourth input control signals in synchronization with a second internal data strobe signal.

According to an embodiment, a semiconductor device may be provided. The semiconductor device may include a data strobe signal buffer configured for buffering first and second data strobe signals to generate a first internal data strobe signal and a second internal data strobe signal in response to a buffer control signal. The semiconductor device may include a reset signal generator configured for detecting phases of the first and second data strobe signals to generate a reset signal, and a first divider configured for generating third and fourth input control signals from first and second input control signals in synchronization with the first internal data strobe signal. The semiconductor device may include a second divider configured for generating the first and second input control signals from the third and fourth input control signals in synchronization with the second internal data strobe signal.

According to an embodiment, a semiconductor system may be provided. The semiconductor system may include a first semiconductor device and a second semiconductor device. The first semiconductor device may be configured to output an external command signal, an external clock signal, a first data strobe signal, a second data strobe signal and a data signal. The second semiconductor device may be configured to decode the external command signal to generate a write command signal and to generate a buffer control signal enabled in synchronization with a point of time that a predetermined section elapses from a point of time that the write command signal is generated.

According to an embodiment, a semiconductor device may be provided. The semiconductor device may include a buffer control signal generation circuit configured to generate a buffer control signal in synchronization with a point of time that a predetermined section elapses from a point of time that a write command signal is generated. The semiconductor device may include an internal data generation circuit configured to receive a data signal to generate internal data, in synchronization with the buffer control signal.

DETAILED DESCRIPTION

Embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices and semiconductor systems including the same.

Figure 1:
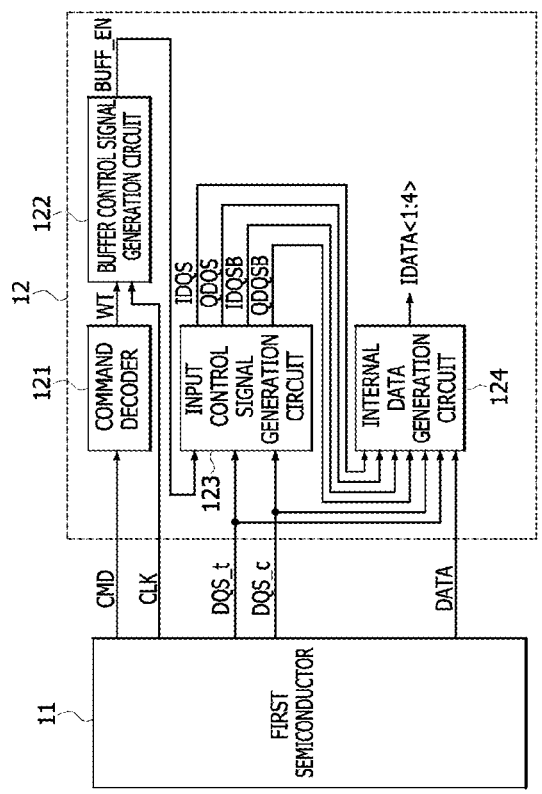
FIG. 1 is a block diagram illustrating a representation of an example of a semiconductor system according to an embodiment.

Referring to FIG. 1, a semiconductor system according to an embodiment may include a first semiconductor device 11 and a second semiconductor device 12. The second semiconductor device 12 may include a command decoder 121, a buffer control signal generation circuit 122, an input control signal generation circuit 123 and an internal data generation circuit 124.

The first semiconductor device 11 may apply an external command signal CMD, an external clock signal CLK, a first data strobe signal DQS_t, a second data strobe signal DQS_c and a data signal DATA to the second semiconductor device 12.

The command decoder 121 may decode the external command signal CMD to generate a write command signal WT for executing a write operation.

The buffer control signal generation circuit 122 may generate a buffer control signal BUFF_EN in response to the write command signal WT and the external clock signal CLK. The buffer control signal BUFF_EN may be enabled in synchronization with a point of time that the write command signal WT is generated or in synchronization with a point of time that a predetermined section elapses after the write command signal WT is generated, according to the various embodiments. The predetermined section may be set to a duration corresponding to a positive integer times a cycle of the external clock signal CLK. In an embodiment, the predetermined section may be set to be a period that remains after subtracting a write preamble section from a write latency (WL) section. The write latency (WL) section may be set to be a period from a point of time that the write command signal WT is generated till a point of time that the data signal DATA is inputted to the second semiconductor device 12. The write preamble section may be set to be a period that is necessary for stabilization of the first and second data strobe signals DQS_t and DQS_c after generation of the first and second data strobe signals DQS_t and DQS_c.

The input control signal generation circuit 123 may receive the first and second data strobe signals DQS_t and DQS_c to generate a first input control signal IDQS, a second input control signal QDQS, a third input control signal IDQSB and a fourth input control signal QDQSB, in response to the buffer control signal BUFF_EN. The first input control signal IDQS may be generated to precede the second input control signal QDQS by a phase of 90 degrees, the second input control signal QDQS may be generated to precede the third input control signal IDQSB by a phase of 90 degrees, and the third input control signal IDQSB may be generated to precede the fourth input control signal QDQSB by a phase of 90 degrees. For example, the first input control signal IDQS may be delayed by a phase of 90 degrees to generate the second input control signal QDQS, the second input control signal QDQS may be delayed by a phase of 90 degrees to generate the third input control signal IDQSB, and the third input control signal IDQSB may be delayed by a phase of 90 degrees to generate the fourth input control signal QDQSB. Ordinal numbers of the input control signals IDQS, QDQS, IDQSB and QDQSB may be set to be different according to the various embodiments.

The internal data generation circuit 124 may receive the data signal DATA to generate first to fourth internal data IDATA<1:4>, in synchronization with the first to fourth input control signals IDQS, QDQS, IDQSB and QDQSB.

Figure 2:
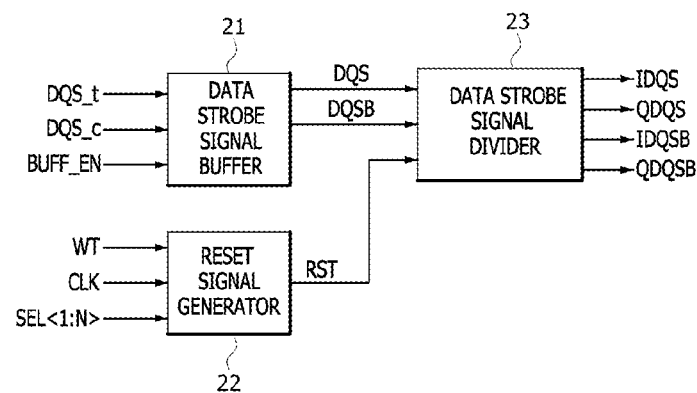
FIG. 2 is a block diagram illustrating a representation of an example of an input control signal generation circuit included in the semiconductor system of FIG. 1.

Referring to FIG. 2, the input control signal generation circuit 123 may include a data strobe signal buffer 21, a reset signal generator 22 and a data strobe signal divider 23.

The data strobe signal buffer 21 may receive the first and second data strobe signals DQS_t and DQS_c to generate a first internal data strobe signal DQS and a second internal data strobe signal DQSB, in response to the buffer control signal BUFF_EN. For example, the data strobe signal buffer 21 may buffer the first and second data strobe signals DQS_t and DQS_c to generate the first and second internal data strobe signals DQS and DQSB if the buffer control signal BUFF_EN is enabled.

The reset signal generator 22 may generate a reset signal RST in response to the write command signal WT, the external clock signal CLK, and first to $N^{th}$ selection signals SEL<1:N>. The reset signal generator 22 may generate the reset signal RST which is enabled in synchronization with a point of time that a predetermined section elapses from a point of time that the write command signal WT is generated. The predetermined section may be set to a duration corresponding to a positive integer times a cycle of the external clock signal CLK. In an embodiment, the predetermined section may be set to be a period that remains after subtracting a write preamble section from a write latency (WL) section. Logic levels of the first to $N^{th}$ selection signals SEL<1:N> may be set by a mode register setting operation which is performed during an initialization operation of the second semiconductor device 12. In an embodiment, N regarding selection signals SEL<1:N> may be an integer greater than one.

The data strobe signal divider 23 may divide the first and second internal data strobe signals DQS and DQSB to generate the first to fourth input control signals IDQS, QDQS, IDQSB and QDQSB. A cycle of the first to fourth input control signals IDQS, QDQS, IDQSB and QDQSB may be set to be twice a cycle of the first and second internal data strobe signals DQS and DQSB. If the reset signal RST is enabled, the data strobe signal divider 23 may initialize the first to fourth input control signals IDQS, QDQS, IDQSB and QDQSB so that the third input control signal IDQSB has an opposite phase to the first input control signal IDQS and the fourth input control signal QDQSB has an opposite phase to the second input control signal QDQS.

Figure 3:
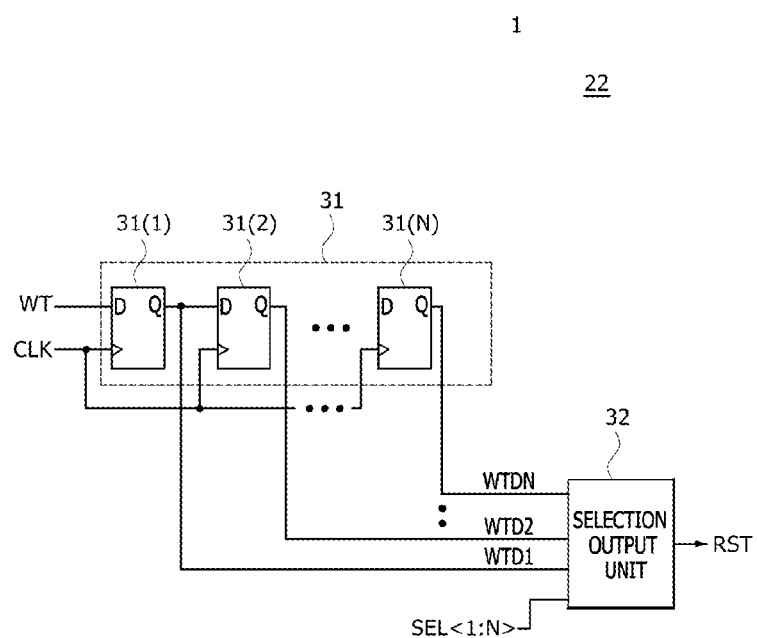
FIG. 3 is a block diagram illustrating a representation of an example of a reset signal generator included in the input control signal generation circuit of FIG. 2.

Referring to FIG. 3, the reset signal generator 22 may include a command delay unit 31 and a selection output unit 32.

The command delay unit 31 may include first to $N^{th}$ shifters 31(1:N). In an embodiment, N may be an integer greater than one. The first shifter 31(1) may shift the write command signal WT by a phase of one cycle of the external clock signal CLK to generate a first delayed write command signal WTD1. The second shifter 31(2) may shift the write command signal WT by a phase of two cycles of the external clock signal CLK to generate a second delayed write command signal WTD2. The $N^{th}$ shifter 31(N) may shift the write command signal WT by a phase of "N" times a cycle of the external clock signal CLK to generate an $N^{th}$ delayed write command signal WTDN.

The selection output unit 32 may select one of the first to $N^{th}$ delayed write command signals WTD1, WTD2, . . . and WTDN to output the selected signal as the reset signal RST, in response to the first to $N^{th}$ selection signals SEL<1:N>. Each of the first to $N^{th}$ shifters 31(1:N) may be realized using a flip flop. Logic levels of the first to $N^{th}$ selection signals SEL<1:N> may be set by a mode register setting operation.

Figure 4:
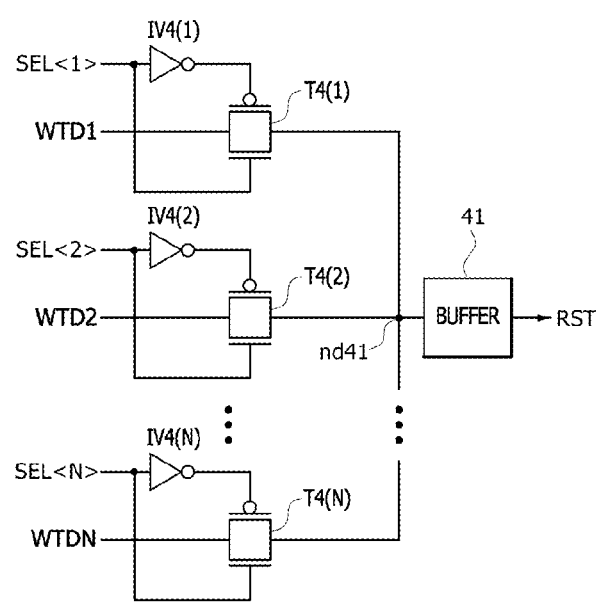
FIG. 4 is a schematic view illustrating a representation of an example of a selection output unit included in the reset signal generator of FIG. 3.

Referring to FIG. 4, the selection output unit 32 may include inverters IV4(1:N), transfer gates T4(1:N) and a buffer 41 (where N may be an integer greater than 1). The selection output unit 32 may transmit the first delayed write command signal WTD1 to a node ND41 through the transfer gate T4(1) which is turned on if the first selection signal SEL<1> is enabled to have a logic "high" level. The selection output unit 32 may transmit the second delayed write command signal WTD2 to the node ND41 through the transfer gate T4(2) which is turned on if the second selection signal SEL<2> is enabled to have a logic "high" level. The selection output unit 32 may transmit the $N^{th}$ delayed write command signal WTDN to the node ND41 through the transfer gate T4(N) which is turned on if the $N^{th}$ selection signal SEL<N> is enabled to have a logic "high" level. The buffer 41 may buffer a signal of the node ND41 to output the buffered signal as the reset signal RST.

Figure 5:
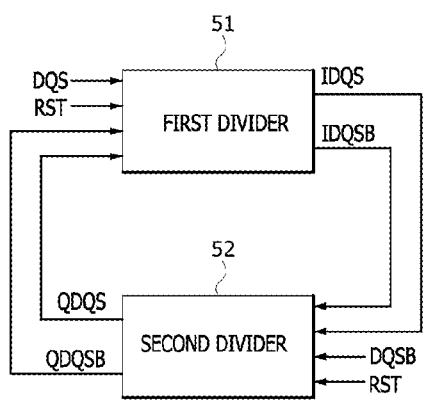
FIG. 5 is a block diagram illustrating a representation of an example of a data strobe signal divider included in the input control signal generation circuit of FIG. 2.

Referring to FIG. 5, the data strobe signal divider 23 may include a first divider 51 and a second divider 52.

The first divider 51 may generate the first and third input control signals IDQS and IDQSB from the second and fourth input control signals QDQS and QDQSB, in synchronization with the first internal data strobe signal DQS. If the reset signal RST is enabled, the first divider 51 may initialize the first and third input control signals IDQS and IDQSB so that the third input control signal IDQSB has an opposite phase to the first input control signal IDQS.

The second divider 52 may generate the second and fourth input control signals QDQS and QDQSB from the first and third input control signals IDQS and IDQSB, in synchronization with the second internal data strobe signal DQSB. If the reset signal RST is enabled, the second divider 52 may initialize the second and fourth input control signals QDQS and QDQSB so that the fourth input control signal QDQSB has an opposite phase to the second input control signal QDQS.

Figure 6:
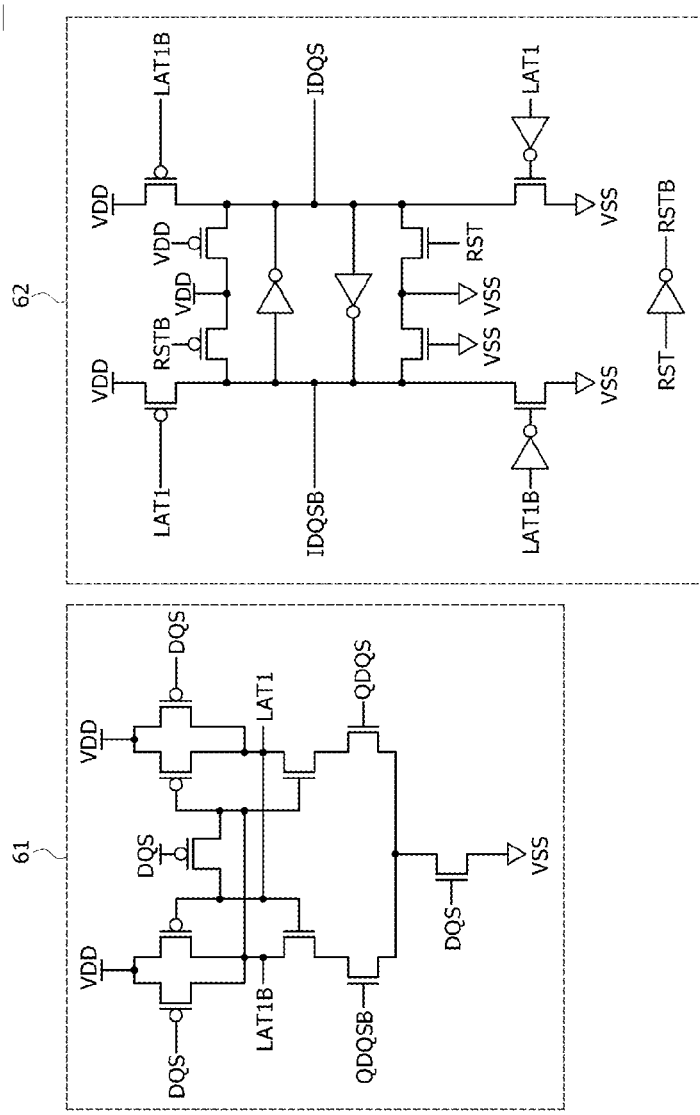
FIG. 6 is a circuit diagram illustrating a representation of an example of a first divider included in the data strobe signal divider of FIG. 5.

Referring to FIG. 6, the first divider 51 may include a first latch signal generator 61 and a first input control signal output unit 62.

The first latch signal generator 61 may receive the second and fourth input control signals QDQS and QDQSB to generate a first latch signal LAT1 and a first inverse latch signal LAT1B, in synchronization with the first internal data strobe signal DQS. If the second input control signal QDQS having a logic "low" level and the fourth input control signal QDQSB having a logic "high" level are inputted to the first latch signal generator 61 while the first internal data strobe signal DQS has a logic "high" level, the first latch signal generator 61 may drive the first latch signal LAT1 to a logic "high" level corresponding to a power supply voltage VDD and may drive the first inverse latch signal LAT1B to a logic "low" level corresponding to a ground voltage VSS. If the second input control signal QDQS having a logic "high" level and the fourth input control signal QDQSB having a logic "low" level are inputted to the first latch signal generator 61 while the first internal data strobe signal DQS has a logic "high" level, the first latch signal generator 61 may drive the first latch signal LAT1 to a logic "low" level corresponding to the ground voltage VSS and may drive the first inverse latch signal LAT1B to a logic "high" level corresponding to the power supply voltage VDD.

If the reset signal RST is enabled to have a logic "high" level and an inverse reset signal RSTB is enabled to have a logic "low" level, the first input control signal output unit 62 may initialize the first and third input control signals IDQS and IDQSB so that the first input control signal IDQS has a logic "low" level corresponding to the ground voltage VSS and the third input control signal IDQSB has a logic "high" level corresponding to the power supply voltage VDD. If the first latch signal LAT1 having a logic "high" level and the first inverse latch signal LAT1B having a logic "low" level are inputted to the first input control signal output unit 62, the first input control signal output unit 62 may drive the first input control signal IDQS to a logic "high" level corresponding to the power supply voltage VDD and may drive the third input control signal IDQSB to a logic "low" level corresponding to the ground voltage VSS. If the first latch signal LAT1 having a logic "low" level and the first inverse latch signal LAT1B having a logic "high" level are inputted to the first input control signal output unit 62, the first input control signal output unit 62 may drive the first input control signal IDQS to a logic "low" level corresponding to the ground voltage VSS and may drive the third input control signal IDQSB to a logic "high" level corresponding to the power supply voltage VDD.

Figure 7:
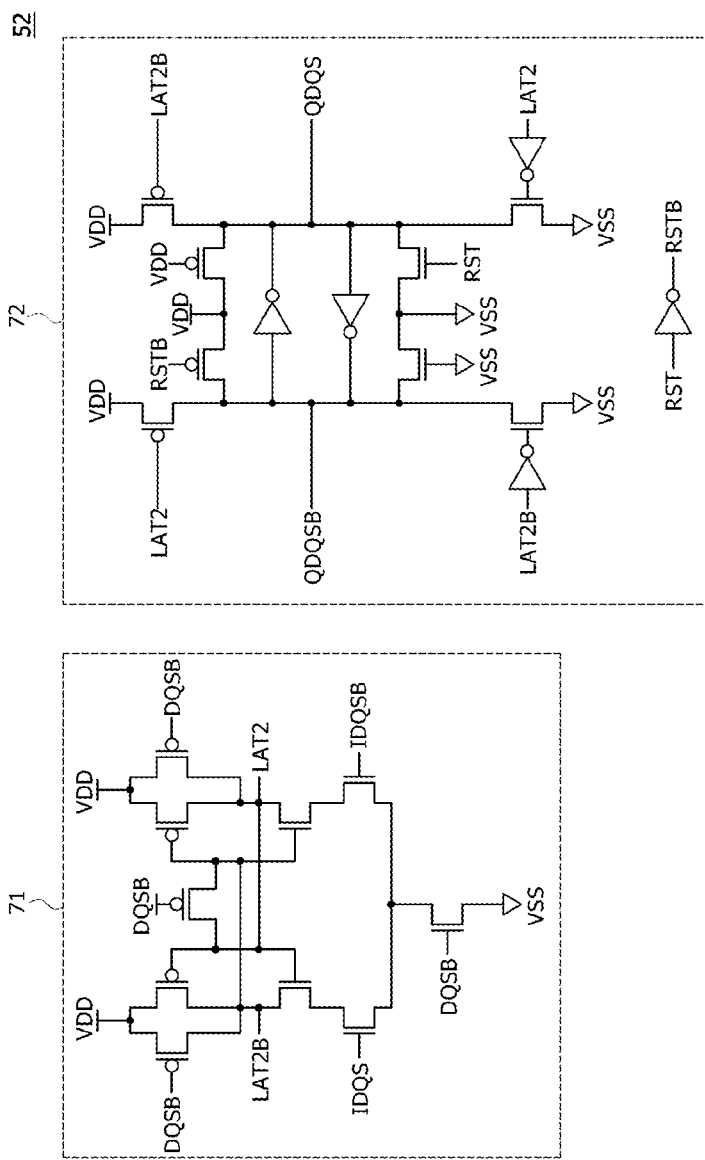
FIG. 7 is a circuit diagram illustrating a representation of an example of a second divider included in the data strobe signal divider of FIG. 5.

Referring to FIG. 7, the second divider 52 may include a second latch signal generator 71 and a second input control signal output unit 72.

The second latch signal generator 71 may receive the first and third input control signals IDQS and IDQSB to generate a second latch signal LAT2 and a second inverse latch signal LAT2B, in synchronization with the second internal data strobe signal DQSB. If the first input control signal IDQS having a logic "high" level and the third input control signal IDQSB having a logic "low" level are inputted to the second latch signal generator 71 while the second internal data strobe signal DQSB has a logic "high" level, the second latch signal generator 71 may drive the second latch signal LAT2 to a logic "high" level corresponding to the power supply voltage VDD and may drive the second inverse latch signal LAT2B to a logic "low" level corresponding to the ground voltage VSS. If the first input control signal IDQS having a logic "low" level and the third input control signal IDQSB having a logic "high" level are inputted to the second latch signal generator 71 while the second internal data strobe signal DQSB has a logic "high" level, the second latch signal generator 71 may drive the second latch signal LAT2 to a logic "low" level corresponding to the ground voltage VSS and may drive the second inverse latch signal LAT2B to a logic "high" level corresponding to the power supply voltage VDD.

If the reset signal RST is enabled to have a logic "high" level and the inverse reset signal RSTB is enabled to have a logic "low" level, the second input control signal output unit 72 may initialize the second and fourth input control signals QDQS and QDQSB so that the second input control signal QDQS has a logic "low" level corresponding to the ground voltage VSS and the fourth input control signal QDQSB has a logic "high" level corresponding to the power supply voltage VDD. If the second latch signal LAT2 having a logic "high" level and the second inverse latch signal LAT2B having a logic "low" level are inputted to the second input control signal output unit 72, the second input control signal output unit 72 may drive the second input control signal QDQS to a logic "high" level corresponding to the power supply voltage VDD and may drive the fourth input control signal QDQSB to a logic "low" level corresponding to the ground voltage VSS. If the second latch signal LAT2 having a logic "low" level and the second inverse latch signal LAT2B having a logic "high" level are inputted to the second input control signal output unit 72, the second input control signal output unit 72 may drive the second input control signal QDQS to a logic "low" level corresponding to the ground voltage VSS and may drive the fourth input control signal QDQSB to a logic "high" level corresponding to the power supply voltage VDD. FIGS. 6 and 7 also illustrate an inverse reset signal RSTB.

Figure 8:
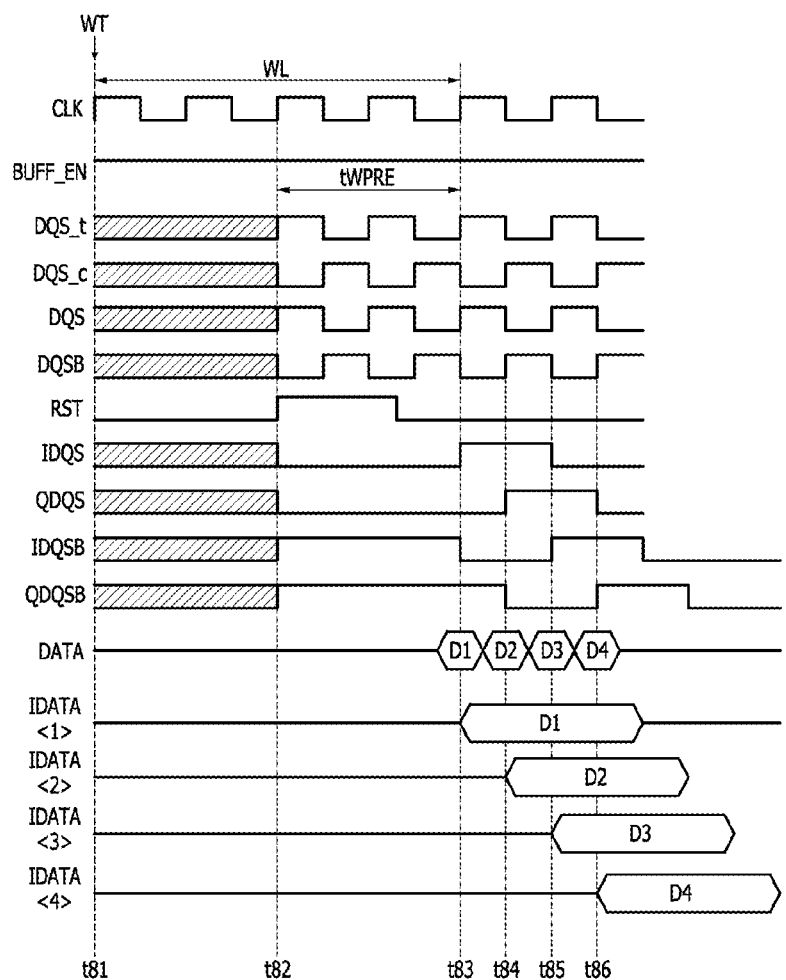
FIG. 8 is a timing diagram illustrating a representation of an example of an operation of a semiconductor system illustrated in FIGS. 1 to 7.

An operation of the semiconductor system having an aforementioned configuration will be described hereinafter with reference to FIG. 8.

At a point of time "t81", if the write command signal WT is generated, the buffer control signal BUFF_EN may be enabled to have a logic "high" level. While the buffer control signal BUFF_EN has a logic "high" level, the first and second data strobe signals DQS_t and DQS_c may be buffered to generate the first and second internal data strobe signals DQS and DQSB. Since the first and second data strobe signals DQS_t and DQS_c have unstable levels during a section from the point of time "t81" till a point of time "t82", the first and second internal data strobe signals DQS and DQSB may also have unstable levels during the section from the point of time "t81" till the point of time "t82". Accordingly, each of the first and second data strobe signals DQS_t and DQS_c and the first and second internal data strobe signals DQS and DQSB is illustrated with slanting lines in a section between the point of time "t81" and the point of time "t82" of FIG. 8.

The reset signal RST may be enabled to have a logic "high" level in synchronization with the point of time "t82" that a predetermined section lapses after the point of time "t81" that the write command signal WT is generated. The predetermined section may be set to be a period that remains after subtracting a write preamble section tWPRE from a write latency (WL) section. In an embodiment, it may be assumed that the write latency (WL) section may be set to be four times a cycle of the external clock signal CLK and the write preamble section tWPRE may be set to be twice a cycle of the external clock signal CLK.

At the point of time "t82", the first and second input control signals IDQS and QDQS may be initialized to have a logic "low" level and the third and fourth input control signals IDQSB and QDQSB may be initialized to have a logic "high" level, in synchronization with the reset signal RST which is enabled to have a logic "high" level.

From a point of time "t83" that the data signal DATA is inputted, the first and second internal data strobe signals DQS and DQSB may be divided to generate the first to fourth input control signals IDQS, QDQS, IDQSB and QDQSB.

At the point of time "t83", since the first internal data strobe signal DQS having a logic "high" level is inputted to the first divider 51 and the second input control signal QDQS having a logic "low" level and the fourth input control signal QDQSB having a logic "high" level are inputted to the first divider 51, the first input control signal IDQS may be driven to a logic "high" level and the third input control signal IDQSB may be driven to a logic "low" level.

At a point of time "t84", since the second internal data strobe signal DQSB having a logic "high" level is inputted to the second divider 52 and the first input control signal IDQS having a logic "high" level and the third input control signal IDQSB having a logic "low" level are inputted to the second divider 52, the second input control signal QDQS may be driven to a logic "high" level and the fourth input control signal QDQSB may be driven to a logic "low" level.

At a point of time "t85", since the first internal data strobe signal DQS having a logic "high" level is inputted to the first divider 51 and the second input control signal QDQS having a logic "high" level and the fourth input control signal QDQSB having a logic "low" level are inputted to the first divider 51, the first input control signal IDQS may be driven to a logic "low" level and the third input control signal IDQSB may be driven to a logic "high" level.

At a point of time "t86", since the second internal data strobe signal DQSB having a logic "high" level is inputted to the second divider 52 and the first input control signal IDQS having a logic "low" level and the third input control signal IDQSB having a logic "high" level are inputted to the second divider 52, the second input control signal QDQS may be driven to a logic "low" level and the fourth input control signal QDQSB may be driven to a logic "high" level.

At the point of time "t83", first data D1 of the data signal DATA may be outputted as first internal data DATA<1> in synchronization with the first input control signal IDQS. At the point of time "t84", second data D2 of the data signal DATA may be outputted as second internal data DATA<2> in synchronization with the second input control signal QDQS. At the point of time "t85", third data D3 of the data signal DATA may be outputted as third internal data DATA<3> in synchronization with the third input control signal IDQSB. At the point of time "t86", fourth data D4 of the data signal DATA may be outputted as fourth internal data DATA<4> in synchronization with the fourth input control signal QDQSB.

As described above, the semiconductor system according to an embodiment may initialize the first and second input control signals IDQS and QDQS to a logic "low" level and the third and fourth input control signals IDQSB and QDQSB to a logic "high" level, using the reset signal RST which is enabled in synchronization with a point of time that a predetermined section elapses from a point of time that the write command signal WT is generated. The first to fourth input control signals IDQS, QDQS, IDQSB and QDQSB may be generated to have stable levels from the write preamble section tWPRE because of the initialization operation.

Figure 9:
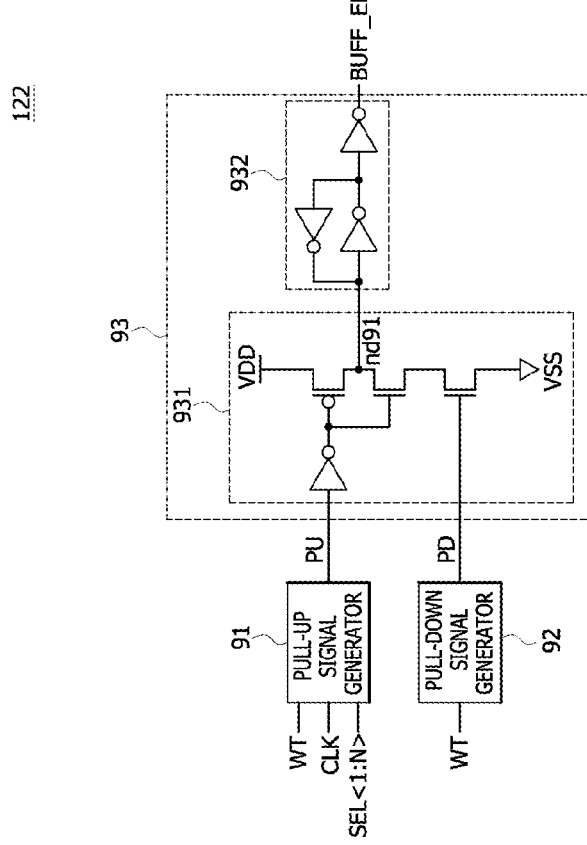
FIG. 9 is a block diagram illustrating a representation of an example of a buffer control signal generation circuit included in the semiconductor system illustrated in FIG. 1.

Referring to FIG. 9, the buffer control signal generation circuit 122 may include a pull-up signal generator 91, a pull-down signal generator 92 and a buffer control signal output unit 93.

The pull-up signal generator 91 may generate a pull-up signal PU in response to the write command signal WT, the external clock signal CLK and the first to $N^{th}$ selection signals SEL<1:N>. The pull-up signal generator 91 may generate the pull-up signal PU in synchronization with a point of time that a predetermined section elapses from a point of time that the write command signal WT is generated. The predetermined section may be set to a duration corresponding to a positive integer times a cycle of the external clock signal CLK. In an embodiment, the predetermined section may be set to be a period that remains after subtracting a write preamble section from a write latency (WL) section. Logic levels of the first to $N^{th}$ selection signals SEL<1:N> may be set by a mode register setting operation which is performed during an initialization operation of the second semiconductor device 12.

The pull-down signal generator 92 may generate a pull-down signal PD in response to the write command signal WT. The pull-down signal generator 92 may generate the pull-down signal PD which is enabled in synchronization with a point of time that the write command signal WT is generated.

The buffer control signal output unit 93 may include a driver 931 and a latch unit 932. The driver 931 may drive a node ND91 to a logic "high" level corresponding to the power supply voltage VDD if the pull-up signal PU is enabled and may drive the node ND91 to a logic "low" level corresponding to the ground voltage VSS if the pull-down signal PD is enabled. The latch unit 932 may latch and buffer a signal of the node ND91 to output the latched and buffered signal as the buffer control signal BUFF_EN.

Figure 10:
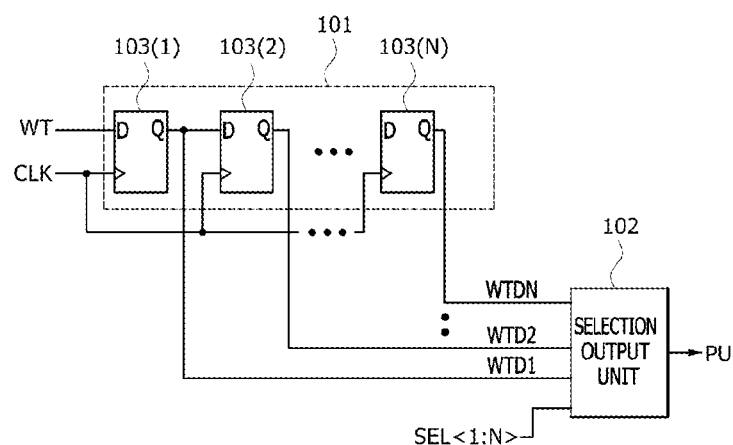
FIG. 10 is a block diagram illustrating a representation of an example of a pull-up signal generator included in the buffer control signal generation circuit of FIG. 9.

Referring to FIG. 10, the pull-up signal generator 91 may include a command delay unit 101 and a selection output unit 102.

The command delay unit 101 may include first to $N^{th}$ shifters 103(1:N) (where N may be an integer greater than one). The first shifter 103(1) may shift the write command signal WT by a phase of one cycle of the external clock signal CLK to generate a first delayed write command signal WTD1. The second shifter 103(2) may shift the write command signal WT by a phase of two cycles of the external clock signal CLK to generate a second delayed write command signal WTD2. The $N^{th}$ shifter 103(N) may shift the write command signal WT by a phase of "N" times a cycle of the external clock signal CLK to generate an $N^{th}$ delayed write command signal WTDN.

The selection output unit 102 may select one of the first to $N^{th}$ delayed write command signals WTD1, WTD2, . . . and WTDN to output the selected signal as the pull-up signal PU, in response to the first to $N^{th}$ selection signals SEL<1:N>. Each of the first to $N^{th}$ shifters 103(1:N) may be realized using a flip flop. Logic levels of the first to $N^{th}$ selection signals SEL<1:N> may be set by a mode register setting operation.

Figure 11:
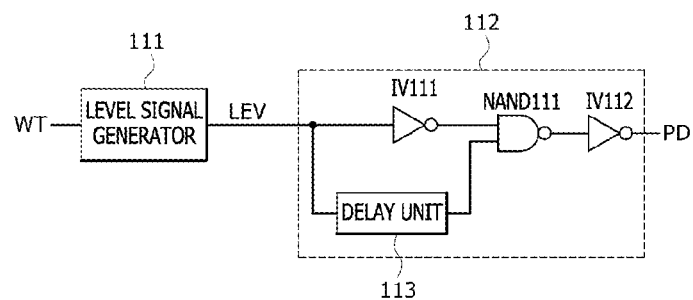
FIG. 11 is a block diagram illustrating a representation of an example of a pull-down signal generator included in the buffer control signal generation circuit of FIG. 9.

Referring to FIG. 11, the pull-down signal generator 92 may include a level signal generator 111 and a pull-down signal output unit 112. The level signal generator 111 may generate a level signal LEV which is enabled to have a logic "low" level if the write command signal WT is generated. The pull-down signal output unit 112 may be configured to include inverters IV111 and IV112, a delay unit 113 and a NAND gate NAND111. The pull-down signal output unit 112 may output a pulse of the pull-down signal PD which is enabled to have a logic "high" level in synchronization with a point of time that the level signal LEV having a logic "low" level is inputted thereto.

Figure 12:
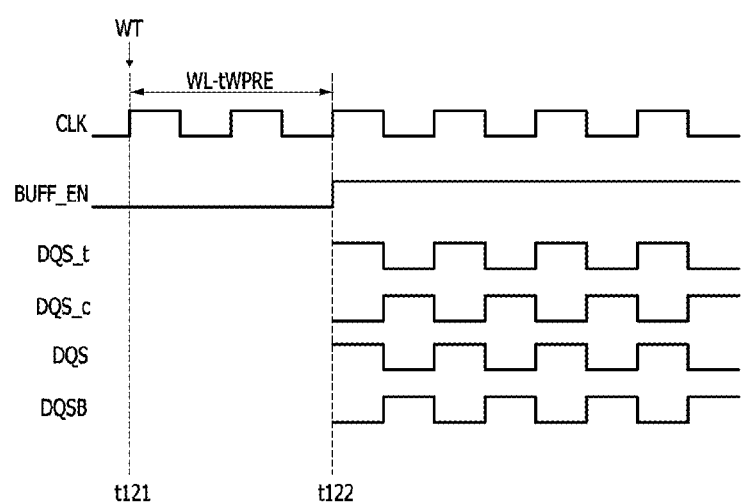
FIG. 12 is a timing diagram illustrating a representation of an example of an operation of a semiconductor system employing a buffer control signal generation circuit illustrated in FIGS. 9, 10 and 11.

Referring to FIG. 12, an operation of a semiconductor system including the buffer control signal generation circuit 122 illustrated in FIGS. 9, 10 and 11 may be confirmed. At a point of time "t121", if the write command signal WT is generated, the buffer control signal BUFF_EN may be enabled to have a logic "high" level in synchronization with a point of time "t122" that a predetermined section elapses from a point of time that the write command signal WT is generated. The predetermined section may be set to be a period that remains after subtracting a write preamble section tWPRE from a write latency (WL) section. From the point of time "t122" that the buffer control signal BUFF_EN is generated to have a logic "high" level, the first and second data strobe signals DQS_t and DQS_c may be buffered to generate the first and second internal data strobe signals DQS and DQSB.

If the buffer control signal generation circuit 122 illustrated in FIGS. 9, 10 and 11 is employed in the semiconductor system illustrated in FIG. 1, the first to fourth input control signals IDQS, QDQS, IDQSB and QDQSB may be stably generated after a predetermined section elapses from a point of time that the write command signal WT is generated.

Figure 13:
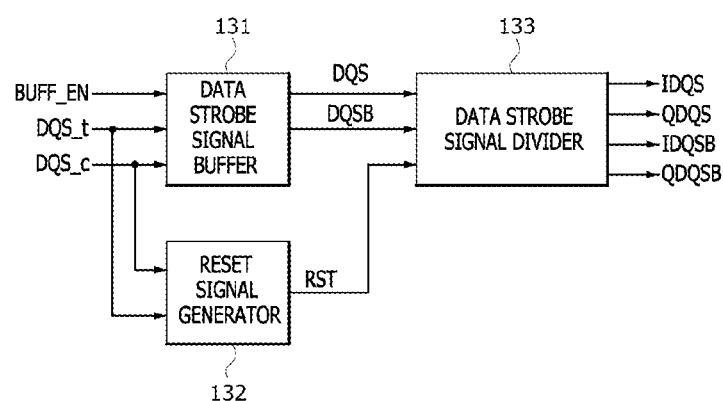
FIG. 13 is a block diagram illustrating a representation of an example of an input control signal generation circuit that can replace the input control signal generation circuit illustrated in FIG. 2.

Referring to FIG. 13, an input control signal generation circuit 123a may include a data strobe signal buffer 131, a reset signal generator 132 and a data strobe signal divider 133.

The data strobe signal buffer 131 may receive the first and second data strobe signals DQS_t and DQS_c to generate the first internal data strobe signal DQS and the second internal data strobe signal DQSB, in response to the buffer control signal BUFF_EN. For example, the data strobe signal buffer 131 may buffer the first and second data strobe signals DQS_t and DQS_c to generate the first and second internal data strobe signals DQS and DQSB if the buffer control signal BUFF_EN is enabled.

The reset signal generator 132 may generate the reset signal RST in response to the first and second data strobe signals DQS_t and DQS_c. The reset signal generator 132 may generate the reset signal RST which is enabled in synchronization with a point of time that the first and second data strobe signals DQS_t and DQS_c have opposite phases to each other.

The data strobe signal divider 133 may divide the first and second internal data strobe signals DQS and DQSB to generate the first to fourth input control signals IDQS, QDQS, IDQSB and QDQSB. A cycle of the first to fourth input control signals IDQS, QDQS, IDQSB and QDQSB may be set to be twice a cycle of the first and second internal data strobe signals DQS and DQSB. If the reset signal RST is enabled, the data strobe signal divider 133 may initialize the first to fourth input control signals IDQS, QDQS, IDQSB and QDQSB so that the third input control signal IDQSB has an opposite phase to the first input control signal IDQS and the fourth input control signal QDQSB has an opposite phase to the second input control signal QDQS. Since the data strobe signal divider 133 has substantially the same configuration as the data strobe signal divider 23 described in detail with reference to FIGS. 5, 6 and 7, a detailed description of the data strobe signal divider 133 will be omitted hereinafter.

Figure 14:
FIG. 14 is a logic circuit diagram illustrating a representation of an example of a reset signal generator included in the input control signal generation circuit of FIG. 13.

Referring to FIG. 14, the reset signal generator 132 may be realized using a logic unit XNOR14 configured for receiving the first and second data strobe signals DQS_t and DQS_c. The logic unit XNOR14 may be configured to execute, for example, an exclusive OR operation of the first and second data strobe signals DQS_t and DQS_c. The reset signal generator 132 may generate the reset signal RST which is enabled in synchronization with a point of time that the first and second data strobe signals DQS_t and DQS_c have opposite phases to each other.

Figure 15:
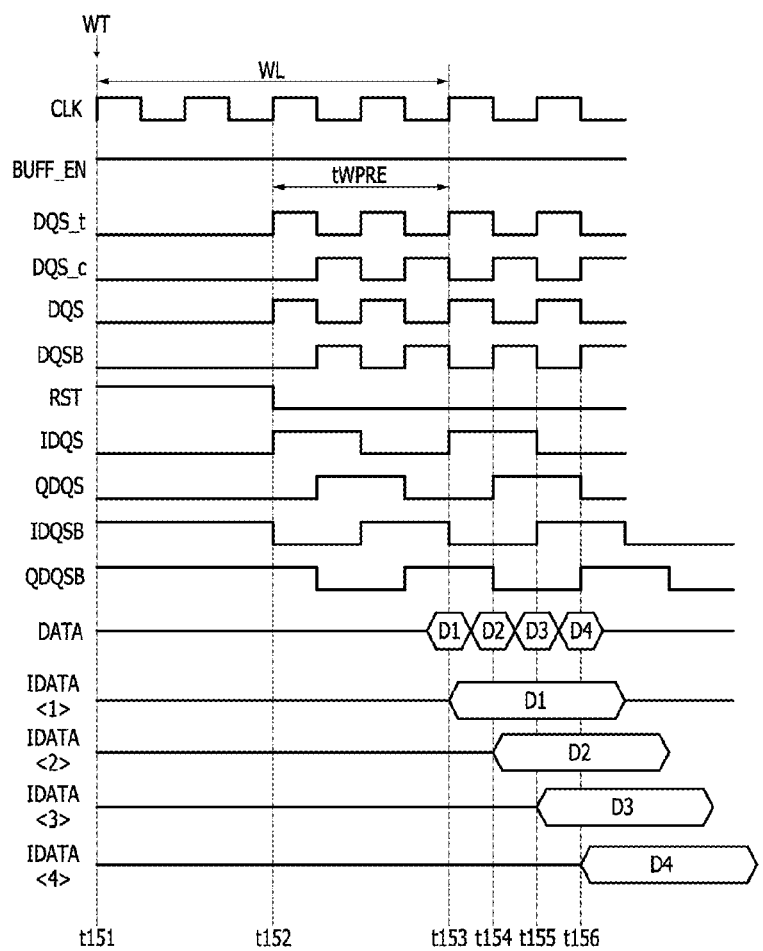
FIG. 15 is a timing diagram illustrating a representation of an example of an operation of a semiconductor system employing the input control signal generation illustrated in FIGS. 13 and 14.

An operation of a semiconductor system including the input control signal generation circuit 123a will be described hereinafter with reference to FIG. 15.

At a point of time "t151", if the write command signal WT is generated, the buffer control signal BUFF_EN may be enabled to have a logic "high" level. While the buffer control signal BUFF_EN has a logic "high" level, the first and second data strobe signals DQS_t and DQS_c may be buffered to generate the first and second internal data strobe signals DQS and DQSB. Since the first and second data strobe signals DQS_t and DQS_c have unstable levels during a section from the point of time "t151" till a point of time "t152", the first and second internal data strobe signals DQS and DQSB may also have unstable levels during the section from the point of time "t151" till the point of time "t152". Accordingly, each of the first and second data strobe signals DQS_t and DQS_c and the first and second internal data strobe signals DQS and DQSB is illustrated with slanting lines in a section between the point of time "t151" and the point of time "t152" of FIG. 15.

Since the first and second data strobe signals DQS_t and DQS_c have opposite phases to each other from the point of time "t152", the reset signal RST may be enabled to have a logic "low" level at the point of time "t152".

At the point of time "t152", the first and second input control signals IDQS and QDQS may be initialized to have a logic "low" level and the third and fourth input control signals IDQSB and QDQSB may be initialized to have a logic "high" level, in synchronization with the reset signal RST which is enabled to have a logic "low" level.

From a point of time "t153" that the data signal DATA is inputted, the first and second internal data strobe signals DQS and DQSB may be divided to generate the first to fourth input control signals IDQS, QDQS, IDQSB and QDQSB.

At the point of time "t153", since the first internal data strobe signal DQS having a logic "high" level is inputted to the first divider 51 and the second input control signal QDQS having a logic "low" level and the fourth input control signal QDQSB having a logic "high" level are inputted to the first divider 51, the first input control signal IDQS may be driven to a logic "high" level and the third input control signal IDQSB may be driven to a logic "low" level.

At a point of time "t154", since the second internal data strobe signal DQSB having a logic "high" level is inputted to the second divider 52 and the first input control signal IDQS having a logic "high" level and the third input control signal IDQSB having a logic "low" level are inputted to the second divider 52, the second input control signal QDQS may be driven to a logic "high" level and the fourth input control signal QDQSB may be driven to a logic "low" level.

At a point of time "t155", since the first internal data strobe signal DQS having a logic "high" level is inputted to the first divider 51 and the second input control signal QDQS having a logic "high" level and the fourth input control signal QDQSB having a logic "low" level are inputted to the first divider 51, the first input control signal IDQS may be driven to a logic "low" level and the third input control signal IDQSB may be driven to a logic "high" level.

At a point of time "t156", since the second internal data strobe signal DQSB having a logic "high" level is inputted to the second divider 52 and the first input control signal IDQS having a logic "low" level and the third input control signal IDQSB having a logic "high" level are inputted to the second divider 52, the second input control signal QDQS may be driven to a logic "low" level and the fourth input control signal QDQSB may be driven to a logic "high" level.

At the point of time "t153", first data D1 of the data signal DATA may be outputted as first internal data DATA<1> in synchronization with the first input control signal IDQS. At the point of time "t154", second data D2 of the data signal DATA may be outputted as second internal data DATA<2> in synchronization with the second input control signal QDQS. At the point of time "t155", third data D3 of the data signal DATA may be outputted as third internal data DATA<3> in synchronization with the third input control signal IDQSB. At the point of time "t156", fourth data D4 of the data signal DATA may be outputted as fourth internal data DATA<4> in synchronization with the fourth input control signal QDQSB.

The semiconductor system according to an embodiment may initialize the first and second input control signals IDQS and QDQS to a logic "low" level and the third and fourth input control signals IDQSB and QDQSB to a logic "high" level, using the reset signal RST which is enabled in synchronization with a point of time that the first and second data strobe signals DQS_t and DQS_c have opposite phases to each other. Thus, the first to fourth input control signals IDQS, QDQS, IDQSB and QDQSB may be generated to have stable levels because of the initialization operation even while the first and second data strobe signals DQS_t and DQS_c have unstable levels.

According to the above embodiments, input control signals may be initialized by a reset signal which is enabled at a point of time that a predetermined section elapses after a write command signal is inputted. This initialization operation may prevent malfunction that occurs due to the input control signals which are unstably generated by data strobe signals inputted unstably.

In addition, according to the above embodiments, buffers for buffering the data strobe signals may be activated at a point of time that a predetermined section elapses after the write command signal is generated or inputted to the buffer control signal generation circuit. Thus, malfunction that occurs due to the input control signals which are unstably generated by the data strobe signals inputted unstably may be prevented.

Moreover, according to the above embodiments, a point of time that the data strobe signals are stably inputted may be detected to stably generate the input control signals.

The semiconductor devices and semiconductor systems discussed above (see FIGS. 1-15) are particular useful in the design of memory devices, processors, and computer systems. For example, referring to FIG. 10, a block diagram of a system employing a semiconductor device and or semiconductor system in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and or semiconductor system as discussed above with reference to FIGS. 1-15. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and or semiconductor system as discussed above with relation to FIGS. 1-15, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

Figure 16:
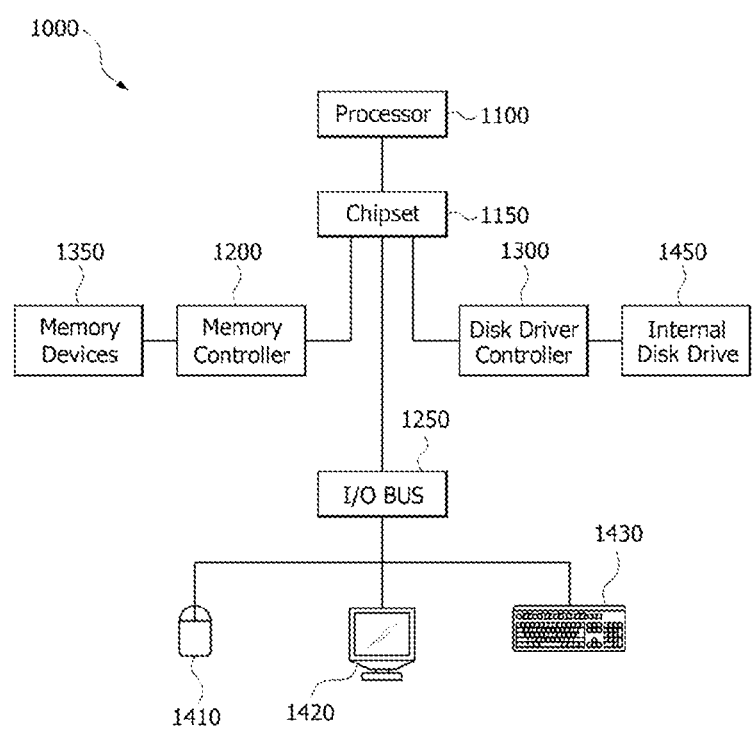
FIG. 16 illustrates a block diagram of an example of a representation of a system employing a semiconductor device and or semiconductor system in accordance with the various embodiments discussed above with relation to FIGS. 1-15.

It is important to note that the system 1000 described above in relation to FIG. 16 is merely one example of a system 1000 employing a semiconductor device and or semiconductor system as discussed above with relation to FIGS. 1-15. In alternate embodiments, such as, for example but not limited to, cellular phones or digital cameras, the components may differ from the embodiments illustrated in FIG. 16.

What is claimed is:

1. A semiconductor device comprising:
  a buffer control signal generation circuit configured for generating a buffer control signal which is enabled in synchronization with a point of time that a predetermined section elapses from a point of time that a write command signal is generated;
  an input control signal generation circuit configured for receiving a data strobe signal to generate an input control signal, in response to the buffer control signal; and
  an internal data generation circuit configured for receiving a data signal to generate internal data, in synchronization with the input control signal.

2. The semiconductor device of claim 1, wherein the predetermined section is set to be a period that remains after subtracting a write preamble section from a write latency (WL) section.

3. The semiconductor device of claim 1, wherein the buffer control signal generation circuit includes:
  a pull-up signal generator configured for generating a pull-up signal in response to the write command signal and an external clock signal;
  a pull-down signal generator configured for generating a pull-down signal in response to the write command signal; and
  a buffer control signal output unit configured for driving and outputting the buffer control signal in response to the pull-up signal and the pull-down signal.

4. The semiconductor device of claim 3,
  wherein the pull-up signal is enabled in synchronization with a point of time that the predetermined section elapses from a point of time that the write command signal is generated; and
  wherein the pull-down signal is enabled in synchronization with a point of time that the write command signal is generated.

5. The semiconductor device of claim 3, wherein the pull-up signal generator includes:
  a command delay unit configured for shifting the write command signal to generate at least two delayed write command signals, in synchronization with the external clock signal; and
  a selection output unit configured for selecting one of the delayed write command signals to output the selected signal as the pull-up signal, in response to a selection signal.

6. The semiconductor device of claim 3, wherein the pull-down signal generator includes:
  a level signal generator configured for generating a level signal in synchronization with the write command signal; and
  a pull-down signal output unit configured for generating the pull-down signal in response to the level signal.

7. The semiconductor device of claim 3, wherein the buffer control signal output unit generates and outputs the buffer control signal, the buffer control signal enabled in response to the pull-up signal and disabled in response to the pull-down signal.

8. The semiconductor device of claim 3, wherein the buffer control signal output unit includes:
  a driver configured for driving an internal node in synchronization with the pull-up signal and the pull-down signal; and
  a latch unit configured for latching a signal of the internal node to generate the buffer control signal.

9. The semiconductor device of claim 1,
wherein the input control signal generation circuit is configured for receiving first and second data strobe signals to generate first to fourth input control signals, in response to the buffer control signal,
wherein the internal data generation circuit is configured for receiving the data signal to generate the internal data, in synchronization with the first to fourth input control signals, and
wherein the input control signal generation circuit includes:
a data strobe signal buffer configured for buffering the first and second data strobe signals to generate a first internal data strobe signal and a second internal data strobe signal, in response to the buffer control signal;
a reset signal generator configured for generating a reset signal, the reset signal enabled in synchronization with a point of time that the predetermined section elapses from a point of time that the write command signal is generated; and
a data strobe signal divider configured for dividing the first and second internal data strobe signals to generate the first to fourth input control signals, in response to the reset signal.

10. The semiconductor device of claim 9, wherein the reset signal generator includes:
a command delay unit configured for shifting the write command signal to generate two or more delayed write command signals, in synchronization with the external clock signal; and
a selection output unit configured for selecting one of delayed write command signals to output the selected signal as the reset signal, in response to a selection signal.

11. The semiconductor device of claim 9, wherein the data strobe signal divider includes:
a first divider configured for generating the third and fourth input control signals from the first and second input control signals in synchronization with the first internal data strobe signal; and
a second divider configured for generating the first and second input control signals from the third and fourth input control signals in synchronization with the second internal data strobe signal.

12. The semiconductor device of claim 9, wherein if the reset signal is enabled, the first and second input control signals are initialized to have opposite phases to each other and the third and fourth input control signals are initialized to have opposite phases to each other.

13. The semiconductor device of claim 1,
wherein the input control signal generation circuit is configured for receiving first and second data strobe signals to generate first to fourth input control signals, in response to the buffer control signal,
wherein the internal data generation circuit is configured for receiving the data signal to generate the internal data, in synchronization with the first to fourth input control signals, and
wherein the input control signal generation circuit includes:
a data strobe signal buffer configured for buffering the first and second data strobe signals to generate a first internal data strobe signal and a second internal data strobe signal, in response to the buffer control signal;
a reset signal generator configured for detecting phases of the first and second data strobe signals to generate a reset signal; and
a data strobe signal divider configured for dividing the first and second internal data strobe signals to generate the first to fourth input control signals, in response to the reset signal.

14. The semiconductor device of claim 13, wherein the reset signal generator generates the reset signal, the reset signal enabled if the first and second data strobe signals have opposite phases to each other.

* * * * *